United States Patent [19]

Bhangu et al.

[11] Patent Number: 5,221,905
[45] Date of Patent: Jun. 22, 1993

[54] TEST SYSTEM WITH REDUCED TEST CONTACT INTERFACE RESISTANCE

[75] Inventors: Labh S. Bhangu, Hopewell Junction; Thomas Morrison, Pleasant Valley, both of N.Y.; Klaus Probst, Herrenberg, Fed. Rep. of Germany

[73] Assignee: International Business Machines Corporation, Armonk, N.Y.

[21] Appl. No.: 843,050

[22] Filed: Feb. 28, 1992

[51] Int. Cl.⁵ .................. G01R 27/14; G01R 31/04
[52] U.S. Cl. ............................. 324/713; 324/158 R; 324/538
[58] Field of Search ............... 324/72.5, 158 R, 538, 324/713

[56]  References Cited
U.S. PATENT DOCUMENTS 3,417,323 12/1968 Williamson .......................... 324/28
4,477,774 10/1984 Revirieux ........................ 324/72.5 X
4,491,797 1/1985 Velsher ............................... 324/421
4,783,631 11/1988 Nakashima et al. ................ 324/538
5,019,771 5/1991 Yang et al. .......................... 324/158

OTHER PUBLICATIONS

*IBM Technical Disclosure Bulletin*, vol. 15, No. 11, Apr. 1973 "Insuring Proper Probe Contact During the Testing of Integrated Circuit Chips," by E. M. Hubacher.

*Primary Examiner*—Kenneth A. Wieder
*Assistant Examiner*—Glenn W. Brown
*Attorney, Agent, or Firm*—Richard Lau

[57]  ABSTRACT

An improved test system includes means for generating a contact wetting pulse and applying the contact wetting pulse to a network such that contact resistance at the interfaces between probes of the test system and terminals of the network is effectively lowered.

7 Claims, 5 Drawing Sheets

TEST SYSTEM WITH REDUCED TEST CONTACT INTERFACE RESISTANCE

TECHNICAL FIELD

This invention relates generally to test systems and, more particularly, to a test system for verifying wiring in electronic products.

BACKGROUND OF THE INVENTION

In the manufacture of electronic products, it is generally required that the wiring of the product be verified by a test system. The electronic products which require such wire verification tests include substrates, printed wiring boards, multi-layer ceramic substrates, etc. Although there are a multitude of wire verification tests that can be performed, the more common types of verification tests are the so-called continuity or short-circuit test and the so-called insulation or open-circuit test. Broadly, a continuity test verifies that an electrical connection or path exists between terminals or points of an electronic product or a device under test (DUT); and an insulation test verifies the absence of electrical connection or the existence of device leakage between points or sets of points of a DUT, i.e., an insulation test verifies that points or sets of points are mutually isolated from each other. The terminals or points are typically terminations of a network of the DUT.

Current day test systems commonly utilize solid state circuitry and employ matrix-type switching systems capable of extremely high-speed operation. For example, the switching system may be capable of being connected to over 260,000 terminals or points, thus allowing for the test system to perform on the order of 6,000–8,000 tests per second. Moreover, the test systems typically have random access capabilities which allow for accessing and testing of the various terminals or points located on a DUT in any desired pattern and sequence.

The testing scheme generally utilized by these test systems to verify wiring includes applying electrical stimulus or signals between selected points of a DUT, measuring the electrical resistance between the points, and comparing the measured resistance to a specified limit. Generally, the specified limit is a user defined maximum or minimum resistive quantity which takes into account known resistances of wires, connectors, etc., which is used to determine whether there should be considered a short-circuit or open-circuit existing between points of an electronic product In this regard, a low limit is a resistive quantity that the measured resistance must not exceed in order for there to be considered a short-circuit existing between the points; and a high limit is a resistive quantity that the measured resistance must exceed in order for there to be considered an open-circuit existing between the points. As an example, the low limit may be on the order of 10 ohms, and the high limit may be on the order of 10 Mohms.

A common problem associated with these test systems is the presence of electrical resistance at the contacts or interfaces between the probes of the test system and the terminals of the DUT being probed. Many causes of this contact resistance are unavoidable. For instance, it is required that small diameter probes be utilized in order to contact small, closely spaced apart terminals; and it is further required that relatively poor electrically conducting probes be utilized in order to maintain the required probe hardness to prevent breakage of the probes when a contact force is applied thereto. Inevitably, this contact resistance is included in the measurement of resistance between points of a DUT, thus causing inaccuracies when conducting short-circuit and open-circuit tests. In other words, the resistance that is measured between terminals of a DUT includes the resistance of the network between the terminals, as well as the contact resistance at the interfaces between the probes of the test system and the terminals of the DUT. Unfortunately, there is no practical method of distinguishing between these resistances when testing.

The inaccuracies caused by contact resistance may be the passing of a network that actually should fail, or the failing of a network that actually should pass. One solution proposes compensating for contact resistance when setting the limits. In other words, adding a compensation resistance to the limit settings in order to compensate for contact resistance. In this regard, the compensation resistance would be an approximation of the contact resistance. However, such a solution has proven unsuccessful since contact resistance varies considerably from one set of probes and terminals to another set of probes and terminals. A further problem is that contact resistance may vary from one test to another even if the same set of probes is used to contact the same set of terminals. Measurements have shown that contact resistance can be anywhere between 1 ohm and 35 ohms. Moreover, measuring the contact resistance between each and every probe and terminal is highly impractical, since there can be between 5,000–35,000, or as much as over 260,000, probe/terminal contacts that would require such a resistance measurement for a given electronic product.

Generally, contact resistance has been found to be a greater problem in testing for short-circuits or continuity as compared to testing for open-circuits. Two examples of how contact resistance and compensation resistance can cause inaccurate results is given below:

| | low limit = 10 ohms compensation resistance = 5 ohms compensated low limit = 15 ohms | | |
|---|---|---|---|
| | contact resistance | network resistance | measured resistance |
| Example I | 9 ohms | 8 ohms | 17 ohms |
| Example II | 2 ohms | 12 ohms | 14 ohms |

Since the resistance of the network of Example I is 8 ohms, which is less than the low limit of 10 ohms, the network of Example I should pass as a short-circuit. However, because of the contact resistance of 9 ohms, the resistance measured by the test system is 17 ohms, which is greater then the compensated low limit of 15 ohms. Therefore, erroneously, the network of Example I will fail the test, i.e., the network will not be regarded as a short-circuit. Similarly, Example II illustrates how compensating for contact resistance can allow a network to pass as a short-circuit when it should actually fail.

SUMMARY OF THE INVENTION

One object of the present invention is to provide a new and improved test system.

Another object of the invention is to provide an improved test system which will perform open-circuit and short-circuit tests with increased accuracy.

Yet a further object of the present invention is to provide an improved test system which has the ability to lower contact resistance at the connection between the test system and the device under test.

Still another object of the invention is to provide an improved test system which will perform open-circuit and short-circuit tests with increased accuracy by lowering contact resistance at the interface between the test system and the device under test.

In accordance with the present invention, there is provided an improved test system of the type which includes a plurality of switching cells. Each switching cell has a probe which electrically interfaces with a terminal of a device under test, and each switching cell is selectively and individually addressable for selecting a first and second switching cell and corresponding first and second terminal. Input signals are generated by a voltage/current source and applied to a network under test via the first switching cell and probe and via the first terminal. In turn, the network responsively generates output signals. The second switching cell and probe receive the output signals from the second terminal and route the output signals to a comparator. The comparator compares the output signals with the input signals and calculates differences in voltage and current, and the electrical resistance of the network can thus be determined. According to the present invention, contact wetting means is further provided for generating a first pulse of increased magnitude, relative to the input signals. This first pulse is applied to the network via the switching cells and probes so as to effectively lower contact resistance at the interfaces between the probes and the terminals.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENTS

Figure 1:
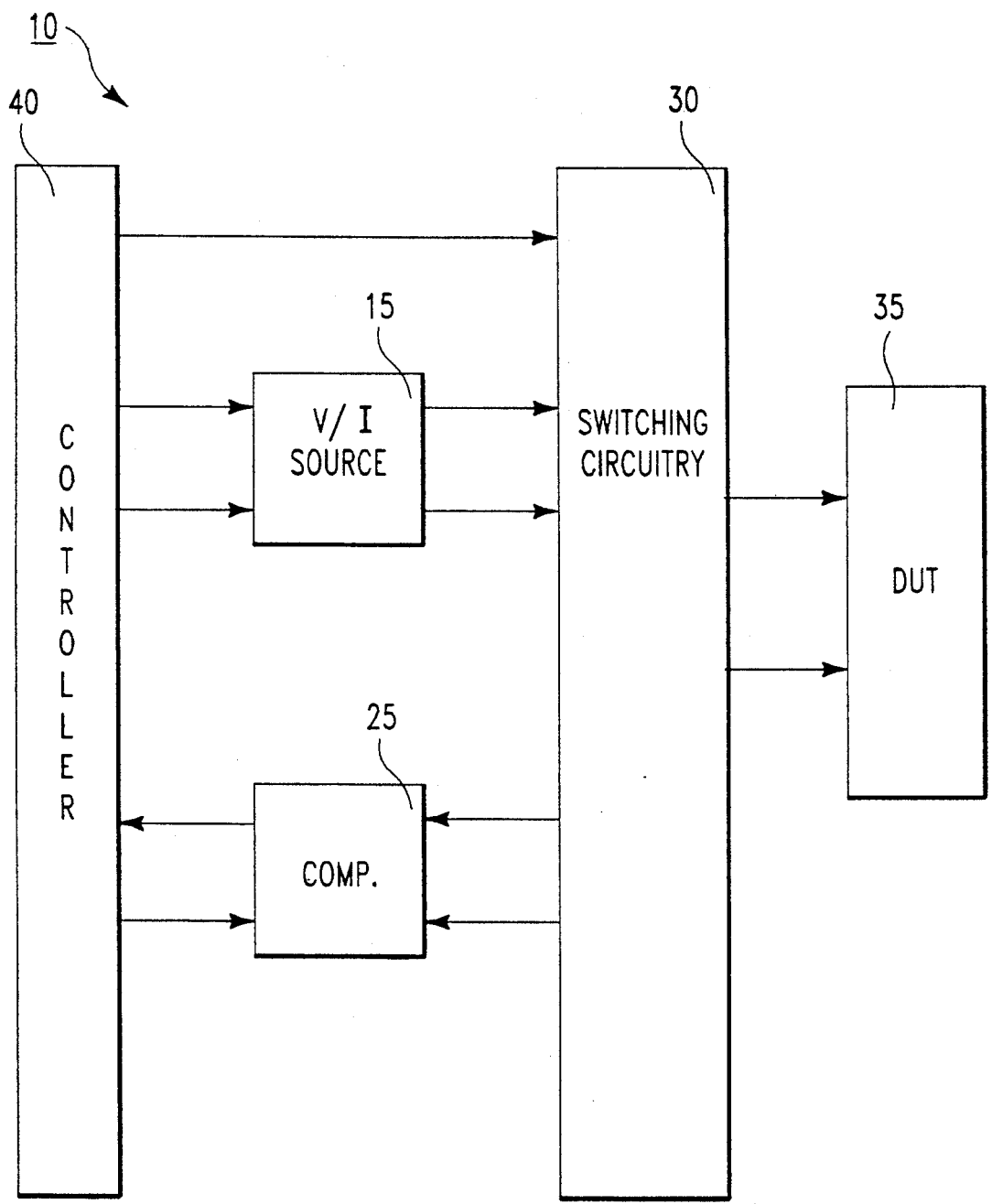
FIG. 1 is a block diagram of a prior art test system.

Referring initially to FIG. 1, there is shown a test system 10 in accordance with the test system described hereinabove in the BACKGROUND OF THE INVENTION. Those skilled in the testing arts will appreciate that the test system 10 is conventional and that the overall concepts and testing scheme employed by the test system 10 are utilized by a number of commercially available test systems.

The test system 10 includes a voltage/current source 15 which is electrically connected to switching means 30. Switching means 30 comprises a plurality of switching cells. In this regard, referring briefly to FIG. 2, switching cells 45,50 are illustrative of the type of circuitry that can be utilized for the switching means 30, and it should be understood that other types of switching circuitry can be used in lieu of the switching cells 45,50. Moreover, although only two switching cells 45,50 are shown, there can be on the order of over 260,000 switching cells included as part of the switching means 30, and such switching cells may be configured in the form of a matrix.

Each switching cell of the switching means 30 is electrically connected to a terminal of the DUT 35, and each cell is in a normally open state. A controller 40 has the capability of electrically accessing or addressing each individual switching cell for regulating closing of each switching cell so that testing can be conducted between any of the terminals of the DUT 35. More specifically, two switching cells may be accessed or addressed for testing if the terminals corresponding to these two cells has an electrical network existing therebetween that must be tested. Thus, the controller 40 includes logic circuitry as required for conducting tests, and may be manually operated or automatically operated by computer.

Generally speaking, when a switching cell is closed, an electrical path is provided so as to allow voltage and current input signals generated by the voltage/current source 15 to be applied to the DUT 35. In response to the input signals being applied thereto, the DUT 35 develops voltage and current output signals. The output signals are then routed to a comparator 25 via the switching means 30, and any drop in the voltage and/or current as initially applied to the DUT 35 is calculated by the comparator 25. This drop in voltage and current is caused by the DUT 35, and is used to determine the measured resistance of the DUT 35 or, more specifically, it is used to determine the measured resistance of the network of the DUT 35 which exists between the particular terminals corresponding to the switching cells being accessed at that given time.

The controller 40 provides the comparator 25 with user defined limits for comparing to the measured resistance. The comparator 25 then makes a determination as to whether the network should be considered an open-circuit or a short-circuit. The results are then fed to the controller 40 for further processing or outputting.

Preferably, for increased testing accuracy and speed, the source 15 and comparator 25 are integrated as a single electronic component.

Figure 2:
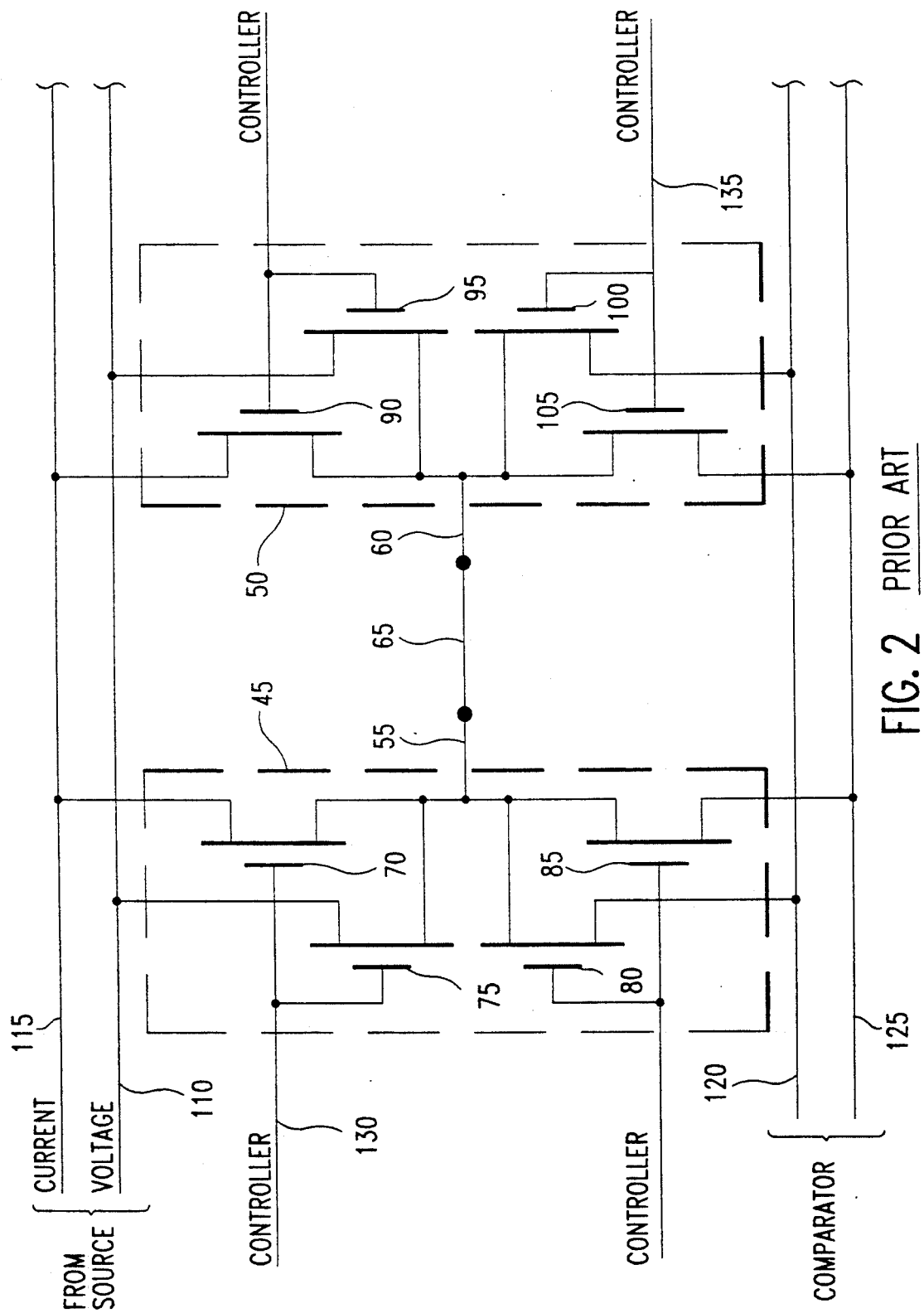
FIG. 2 is a schematic diagram of prior art switching cells that can be employed in the test system of FIG. 1.

Referring now to FIG. 2, each switching cell 45,50 has a corresponding probe 55,60 connected thereto for electrically interfacing with a respective terminal of a network 65 of the DUT 35. Each switching cell 45,50 includes four field-effect transistors 70-105, which may be D-type MOS transistors, as switching elements. Transistors 70,75,90 and 95 are referred to herein as "from" transistors and transistors 80,85,100 and 105 are referred to herein as "to" transistors. These transistors may be configured in the form of a 4-wire Kelvin-bridge type circuit. During a test, the current and voltage signals will flow from one of the cells, via the cell's "from" transistors, and be applied to the network 65 for developing output signals. The output signals will then be received by the other cell by way of the other cell's "to" transistors.

In operation, the controller 40 sends control signals to the gate terminals of the "from" transistors of one of the switching cells 45 or 50, regulating these transistors to allow current to flow therethrough, i.e., the control signals will render the "from" transistors operational or conductive for testing; and the controller 40 will also send control signals to the gate terminals of the "to" transistors of the other switching cell, rendering these transistors conductive. Thus, electrical signals will be allowed to flow from the source to drain of the selected "from" and "to" transistors.

As a specific example, if the "from" transistors 70,75 of switching cell 45 are selected by the controller 40, via line 130, to perform a test, and the "to" transistors 100,105 of switching cell 50 are selected by the controller 40, via line 135, to perform the test, then current and voltage input signals generated by the source 15 flow through lines 115 and 110, and are applied to the network 65 via the "from" transistors 70,75 of switching cell 45 and probe 55. In response to the input signals, the network 65 develops current and voltage output signals. The output signals are output from the network 65 to probe 60, and received by the "to" transistors 100,105 of switching cell 50. These transistors 100,105 route the output signals to the comparator 25 via lines 120 and 125, so that the comparator 25 can determine if there is any drop in current and voltage. It is important to realize that this drop in current and voltage is not only caused by the resistance of the network 65, but is also caused by the contact resistance existing at the interfaces between the probes 55,60 and the terminals of the network 65. Furthermore, it should be noted that the electrical lines for routing the voltage and current signals during testing also have resistance. However, this line resistance is known and constant and can thus be readily accounted for during testing.

Although the switching cells 45,50 illustrated in FIG. 2 have the advantages of high speed and low power requirements, the cells 45,50 have the drawback of being limited in regard to the amount of test current that can be applied to the network 65 via the transistors 70-105. Specifically, the maximum allowable test current that can be used is approximately 20 mA for DC operation. In this regard, although increasing test current may result in greater testing accuracy when performing continuity tests, increasing test current will also result in leakage of the transistors 70-105 during testing. Such leakage of the transistors 70-105 causes inaccurate test results. Moreover, although increasing test current would decrease contact resistance, the amount of test current utilized during a test should not be increased because of this problem of leakage. Thus, the problem of contact resistance causing inaccurate test results, as outlined hereinabove, persists in these types of test systems.

Figure 3:
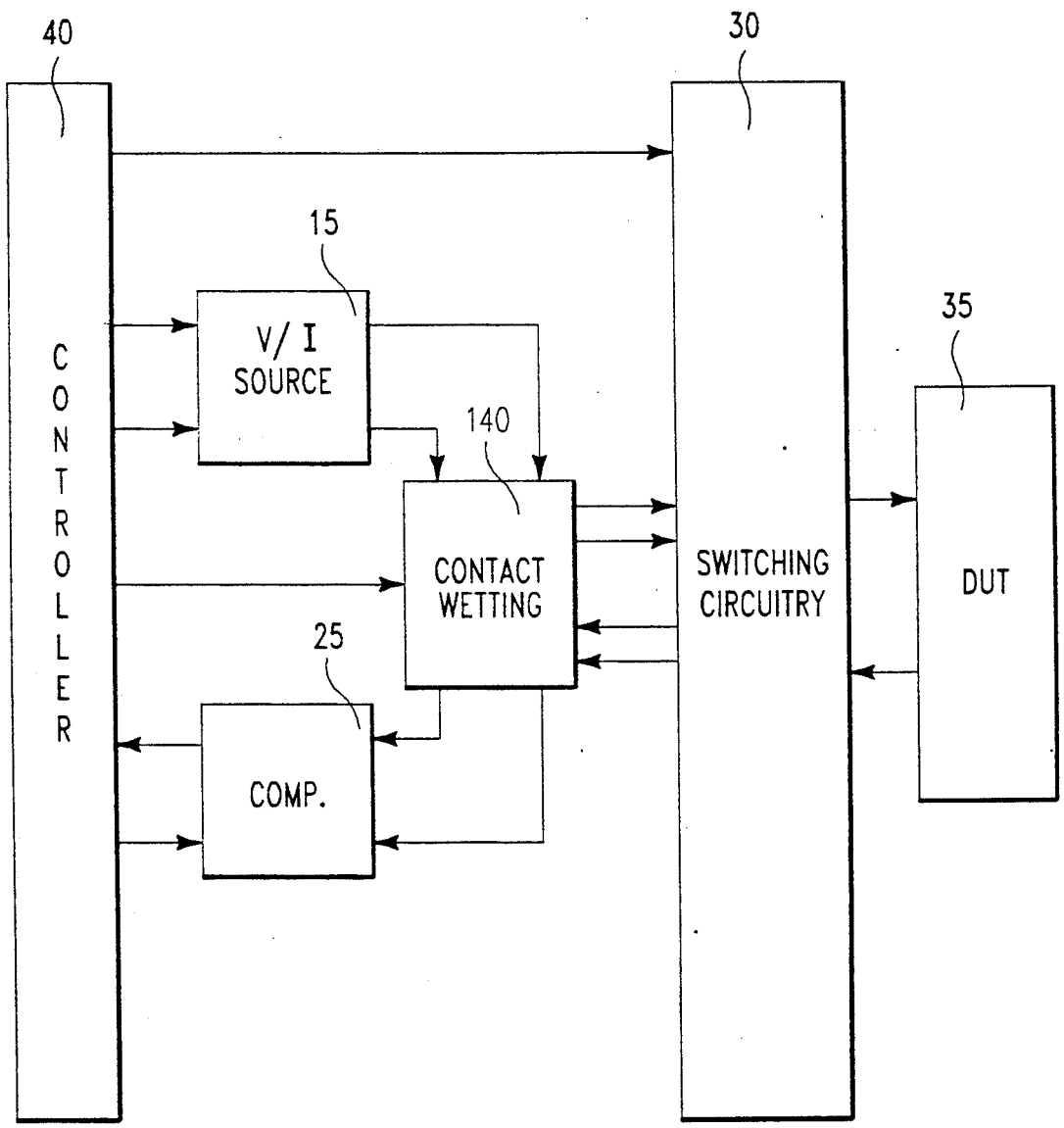
FIG. 3 is a block diagram of a test system in accordance with the present invention.

Reference is now made to FIG. 3 which illustrates the test system 10 of FIG. 1 modified in accordance with the present invention. As shown, contact wetting means 140 is electrically connected between the voltage/current source 15 and switching means 30, and also between the comparator 25 and switching means 30. It is preferable, for purposes of increasing test speed and accuracy, that the source 15, the comparator 25 and the contact wetting means 140 be integrated as a single electronic component.

The contact wetting means 140 comprises pulse means for generating a pulse of increased magnitude, relative to the current and voltage input signals initially generated by the voltage/current source 15, for applying to the DUT 35 and effectively electrically wetting the connection or interface between the switching means 30 and the terminals of the DUT 35 so that any resistance existing therebetween is decreased or preferably eliminated.

In the preferred embodiment, the controller 40 is in electrical communication with the contact wetting means 140 so that the controller 40 can regulate operation thereof. Thus, in order to conserve power and test cycle time, the contact wetting means 140 can be designed to be inoperative during normal testing, and operative only when the controller 40 receives a signal indicating that a network of the DUT 35 has a measured resistance which is higher than the limit set therefor. The controller 40 will then send a control signal so as to render the contact wetting means 140 operative. The contact wetting means 140 will then generate a pulse of increased magnitude, relative to the current and voltage input signals generated by the source 15, and apply the pulse to the network of the DUT 35 so as to lower or eliminate any contact resistance existing at the connection between the switching means 30 and the terminals of the DUT 35. The network can then be retested to determine whether or not the initial high measured resistance was due to contact resistance between the connection of the switching means 30 and the terminals of the DUT 35. More particularly, if the network now has a measured resistance that is still higher than the limit, then there is reasonable likelihood that this high measured resistance is caused by the resistance of the network itself; however, if the network now has a measured resistance that is lower than the limit, then it can be appreciated that the original high measured resistance was caused by the contact resistance, and not by the resistance of the network.

Those skilled in the electrical arts will appreciate that a multitude of different designs can be utilized for the contact wetting means 140. For example, the contact wetting means 140 can comprise amplification circuitry capable of developing a pulse using the signals generated by the voltage/current source 15, or the contact wetting means 140 can comprise a current source capable of independently generating the required pulse. The contact wetting means 140 of a preferred embodiment as incorporated with the switching cells 45,50 of FIG. 2 is illustrated in FIG. 4 and described in detail hereinbelow.

Figure 4:
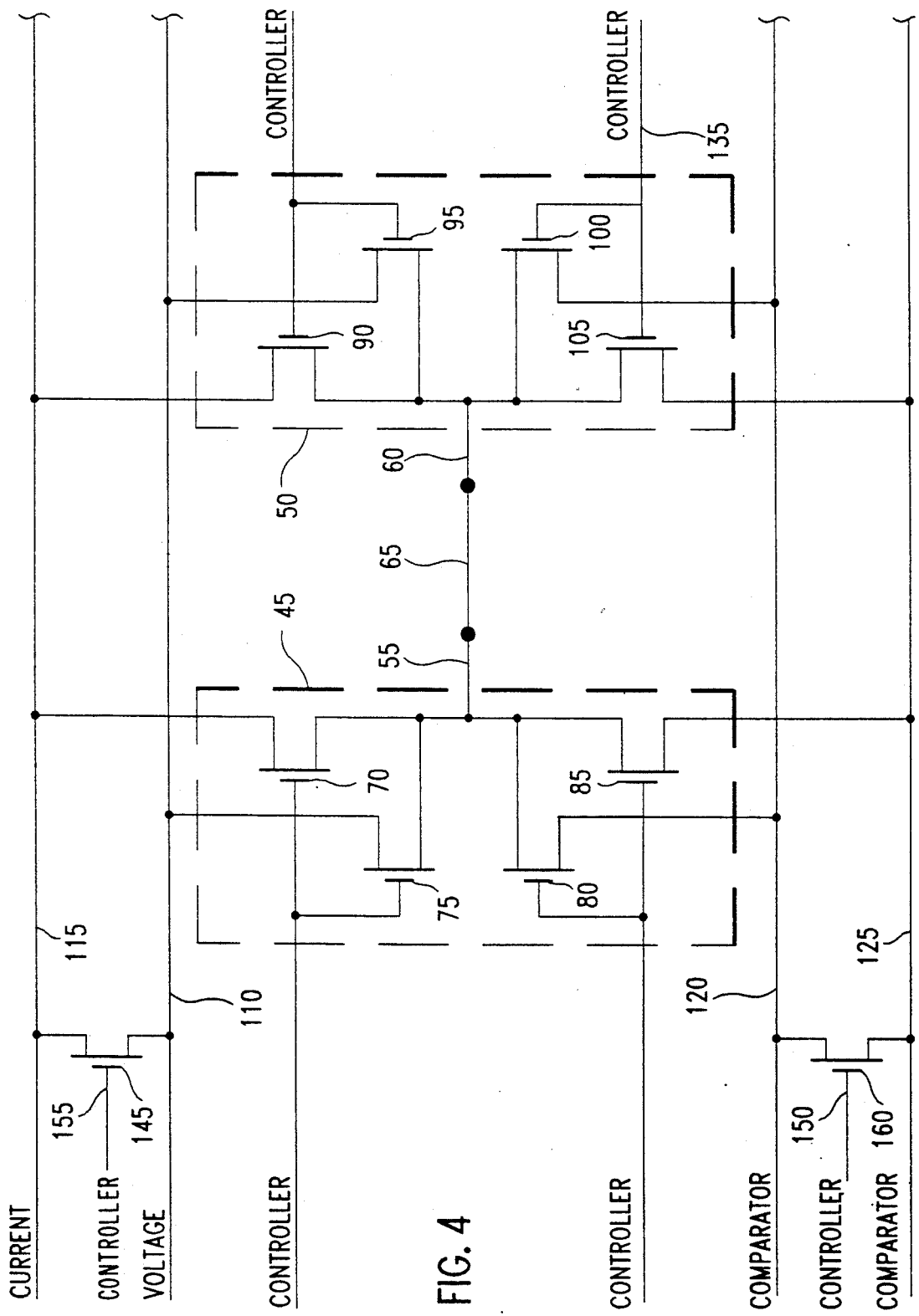
FIG. 4 is a schematic diagram of switching cells in accordance with the present invention.

Referring now to FIG. 4, the contact wetting means 140 comprises D-type MOS field-effect transistors 145 and 150. The gate terminals of transistors 145 and 150 are electrically connected to the controller 40 via lines 155 and 160, the source and drain terminals of transistor 145 connect to lines 110 and 115, and thereby connect to the voltage/current source 15; and the source and drain of transistor 150 connect to lines 120 and 125, and thereby connect to the comparator 25. When the controller 40 sends a control signal rendering the transistors 145 and 150 conductive, transistor 145 causes lines 110 and 115 to be short-circuited, and transistor 150 causes lines 120 and 125 to be short-circuited. Such short-circuiting of the lines 110 and 115 from the voltage/current source 15 results in a paralleling of the "from" and "to" transistors 70-105 of each of the switching cells 45,50, and the network 65. Thus, a single pulse of increased magnitude is developed by combining the voltage and current signals generated by the voltage/current source 15.

This single pulse is applied to the network 65 via one of the probes and via the "from" transistors of one of the switching cells, and received by the other probe and the "to" transistors of the other switching cell. Thus, an electrical wetting of the interfaces between each probe 55,60 and its corresponding terminal of the network 65 is accomplished, and a lowering or elimination of contact resistance is realized. As mentioned above, the network 65 can then be retested.

Typical test operation includes generation of approximately 20 mA amps of current and approximately 100 volts of voltage by the source 15. Under these conditions, the normal test current applied to the network 65 for testing is approximately 20 mA. However, the use of the present invention has provided for a contact wetting pulse of approximately 100 mA, or about 5 times the normal test current. Application of such a pulse to the interfaces between the probes 55,60 and the terminals of the network 65 has been shown to reduce contact resistance of between 1 ohm and 35 ohms to less than approximately 1 ohm, thus providing increased accuracy in testing by reducing false open-circuit determinations.

A further problem involves polarity sensitive contact resistance that may exist at the interfaces between the probes 55,60 and the terminals of the network 65. Such a problem is caused by diode effects at the probe interfaces. A solution to this problem is the application of multiple pulses of alternating polarity, i.e., AC pulses. Alternating the polarity of pulses can be accomplished by applying a pulse to the network in one direction, then, subsequently, applying another pulse to the network in the opposite direction. For example, referring to FIG. 4, the "from" transistors 70,75 of switching cell 45 and the "to" transistors 100,105 of switching cell 50 can be rendered conducting so as to allow a first pulse to be applied to the network 65 in one direction. Then, subsequently, these transistors can be turned off and the "from" transistors 90,95 of switching cell 50 and the "to" transistors 80,85 of switching cell 45 can be rendered conducting so as to allow a second pulse to be applied to the network 65 in the opposite direction. Of course, as described hereinabove, each of the first and second pulses are developed by combining the voltage and current signals generated by the voltage/current source 15.

Figure 5:
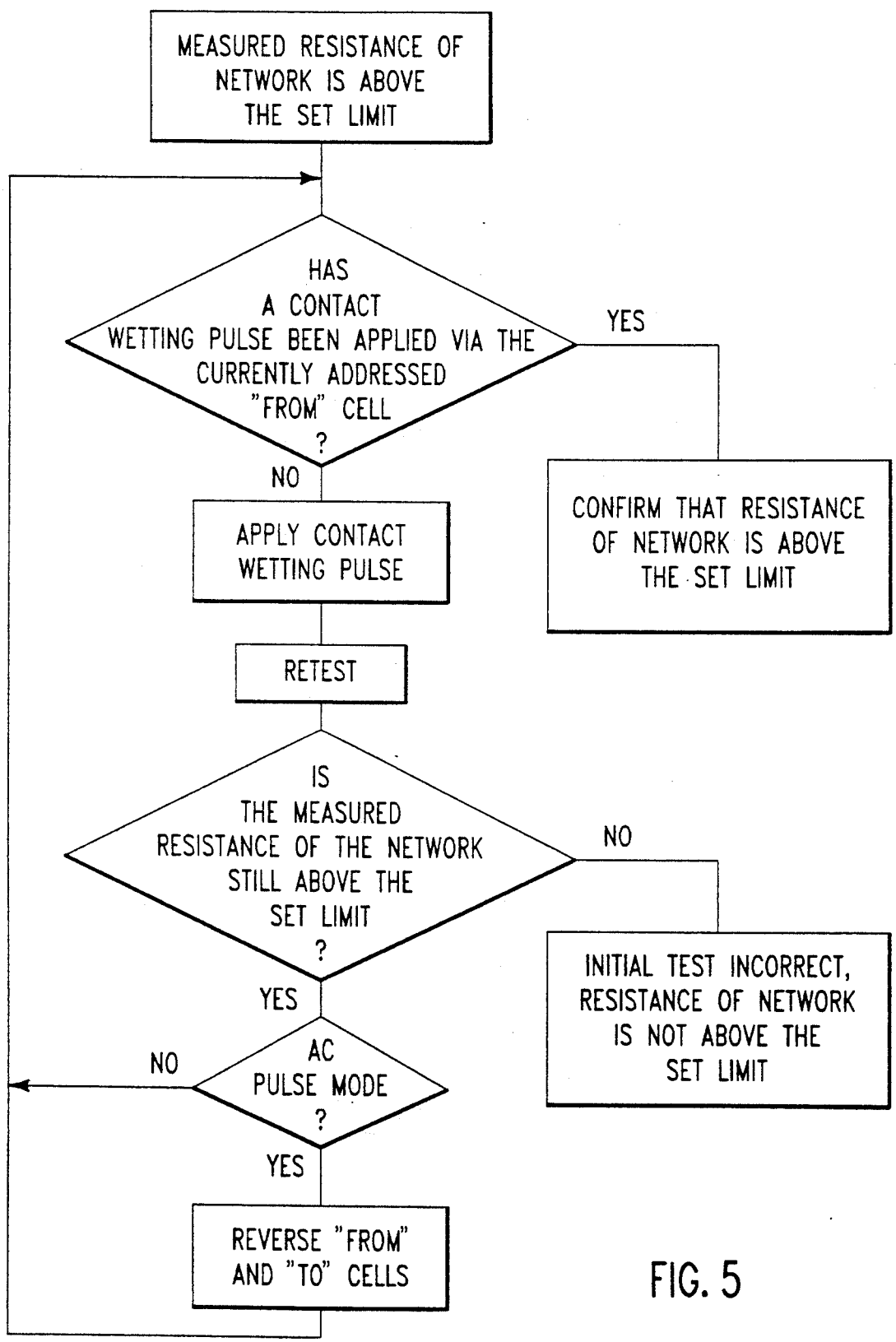
FIG. 5 is a flowchart illustrating the method of operation in accordance with the present invention.

FIG. 5 illustrates the method of operation in accordance with the invention. The flowchart begins with a determination that the network under test has been measured to have a resistance which is above the set limit. If a contact wetting pulse has already been applied to the contacts or interfaces between the probes and terminals via the currently addressed "from" cell, then no further testing will be conducted and it is confirmed that the resistance of the network is above the set limit. However, if a contact wetting pulse has not already been applied to the interfaces via the currently addressed "from" cell, then a pulse will be applied to the network for contact wetting, and the network will be retested. If the retest determines that the resistance of the network is not above the set limit, then the original test was incorrect and the resistance of the network actually is not above the set limit, i.e., the original high measured resistance was caused by contact resistance and not the network itself.

Further, if the retest determines that the measured resistance of the network is above the set limit, then a further determination can be made to determine whether or not the testing is being conducted in the AC contact wetting pulse mode. If testing is not being conducted in the AC pulse mode, then no further testing is required and it is confirmed that the resistance of the network is above the set limit. However, if testing is being conducted in the AC pulse mode, then the "from" and "to" switching cells will be reversed and a second contact wetting pulse will be applied to the network, and the network will be retested again. More particularly, the original "from" cell will be used as the "to" cell for application of the second pulse, and the original "to" cell will be used as the "from" cell for application of the second pulse. Thus, the second pulse can be applied to the network in the opposite direction relative to the originally applied pulse and, subsequently, the network can again be retested.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An improved test system of the type which includes a plurality of switching cells, each switching cell having a probe which electrically interfaces with a terminal of a device under test, and each switching cell being selectively and individually addressable for selecting a first and second switching cell and corresponding first and second terminal for allowing voltage and current input signals generated by a voltage/current source to be applied to a network of the device under test by way of the first switching cell and probe and by way of the first terminal, the network responsively developing voltage and current output signals, and said second switching cell and probe receiving said output signals by way of said second terminal and routing said output signals to a comparator for comparing said output signals with said input signals for calculating differences in voltage and current, for determining electrical resistance of the network, wherein the improvement comprises:

contact wetting means for generating a first pulse of increased magnitude, relative to the input signals, and applying said first pulse to the network by way of said switching cells and probes, and said contact wetting means further generating a second pulse and applying said second pulse to the network by way of said switching cells and probes in a direction of flow which is opposite to the direction of flow of said first pulse, wherein contact resistance at the interfaces between said probes and said terminals is effectively lowered.

2. An improved test system according to claim 1, wherein said first pulse has a magnitude which is on the order of 5 times greater than the magnitude of said input signals.

3. An improved test system according to claim 1, wherein said contact wetting means comprises pulse means for combining voltage and current input signals generated by the source, for generating said first pulse.

4. An improved test system according to claim 3, wherein said pulse means comprises a plurality of switches allowing for controllably combining the voltage signal with the current signal.

5. An improved test system according to claim 4, wherein said switches comprises transistors.

6. An improved test system according to claim 5, wherein said transistors are D-type MOS field effect transistors.

7. An improved test system according to claim 1, wherein said contact wetting means is operative when the network resistance is greater than a preset limit, and inoperative, when the network resistance is less than the preset limit.

* * * * *